United States Patent [19]

Shin et al.

[11] Patent Number: 5,232,567
[45] Date of Patent: Aug. 3, 1993

[54] PROCESS FOR FABRICATING OF A MAGNETO-OPTICAL RECORDING MEDIUM

[75] Inventors: Sung C. Shin, Taejeon; Jin H. Kim, Daejeon, both of Rep. of Korea

[73] Assignee: Gold Star Co., Ltd., Seoul, Rep. of Korea

[21] Appl. No.: 989,470

[22] Filed: Dec. 8, 1992

Related U.S. Application Data

[63] Continuation of Ser. No. 766,548, Sep. 27, 1991, abandoned.

Foreign Application Priority Data

Sep. 29, 1990 [KR] Rep. of Korea ............ 15676/1990

[51] Int. Cl.$^5$ ............................................. B05D 5/12
[52] U.S. Cl. ................................. 204/192.1; 427/131; 427/132; 427/294; 427/300; 427/561
[58] Field of Search ............... 204/192.1; 427/131, 427/132, 294, 300, 561

[56] References Cited

PUBLICATIONS

Sung-Chul Shin and Anthony C. Palumbo, J. Appl. Phys., 67(1), pp. 317–320, (1990).

Primary Examiner—Bernard Pianalto
Attorney, Agent, or Firm—Finnegan, Henderson, Farabow, Garrett & Dunner

[57] ABSTRACT

A mass production process for fabrication of a magneto-optic recording medium is disclosed. The process comprises alternately arranging first and second metal regions upon a target, installing isolating plates between adjacent regions, and moving a substrates over the target. When moving the substrates, a voltage is supplied to the target so that first and second metal regions alternatively deposit on the substrates in a continuous manner to form a multi-layer structure.

14 Claims, 2 Drawing Sheets outer magnetic field direction

T>Curie Temperature(Tc)

outer magnetic field direction

T>Tc

PROCESS FOR FABRICATING OF A MAGNETO-OPTICAL RECORDING MEDIUM

This application is a continuation of application Ser. No. 07/766,548, filed Sept. 27, 1991, now abandoned.

FIELD OF THE INVENTION

The present invention relates to a process for fabrication of a magneto-optic recording medium, and particularly to a thin multi-layer type magneto-optic recording medium including Co/Pd or Co/Pt thin films.

BACKGROUND OF THE INVENTION

Generally, in the magneto-optic recording process, a magnetic thin film having a perpendicular magnetic easy axis is used as a binary digital information storing system by magnetizing upwardly or downwardly.

Information recording is carried out as shown in FIG. 1A. A magnetic field of about 300 Oe is externally applied in the polarizational angle of desired direction, and at the same time the medium is heated by laser beams up to the Curie temperature above which the medium becomes paramagnetic. The laser beams are then withdrawn to allow the scanned regions of the medium to be magnetized in the same polarity as the external magnetic field, thereby recording the information.

As shown in FIG. 1B, the reading of the recorded information is carried out by utilizing the Polar Kerr effect. That is, if rotational polarized light rays are scanned onto a vertically magnetized material, the reflected light rays are rotated around the polarizing direction of the incoming light rays. The magnitude of the rotational angle depends on the magnitude of magnetization, and the rotational direction is clockwise or counterclockwise in accordance with the magnetized direction. The light rays which are reflected from the upwardly and downwardly magnetized spots are detected, by a photodiode thereby the information is read as a "1" or a "0".

As shown in FIG. 1C, recorded information is erased by applying the external magnetic field in a direction opposite to that of the recording magnetic field with an irradiating laser beam. Such recording, erasing and re-writing can be repeated infinitely by reversing the applied magnetic field.

In the currently used magneto-optic recording media, a thin film consisting of a rare earth-transition metal alloy is employed. The rare earth elements include Tb, Gd, Nd and Dy, while the transition metals include Fe, Co, and the like. One of the most superior recording media a Tb-Fe-Co thin film Sputtering and evaporation methods are principally used in manufacturing the rare earth transition motal alloy films. In the case of sputtering, an alloy target may be employed, or as in Co-sputtering, the rare earth and the transition metals serve as plural targets with an irradiating laser beam.

In the rare earth-transition metal alloy recording media, oxidation readily occurs because the rare earths have a high affinity for oxygen. In order to prevent oxidation, and to increase the rotational angle by multiple reflection during information reading, the recording layer is sandwiched by a dielectric medium. Among the known materials for the protective layer are $Si_3N_4$, AlN, and other nitrides.

Yet, in the above described conventional technique, the rare earth-transition metal alloy recording medium is still likely to oxidize because the rare earths have such great affinities for oxygen. Although dielectric layers are employed in order to prevent the oxidation, this protection is not always sufficient.

Further, the recording medium is sensitive to the manufacturing process, and the yield is only about 10%. A technique to overcome the above described problems has been published: "Magnetic Optical Properties of Co/Pd Superlative Thin Film", J. Appl. Phys., 67, p. 317 (1990).

According to the published technique, the magneto-optic recording medium includes a multi-layer film of Co/Pd. The thickness of the Co sub-layer is 1-5 and the Pd sub-layer is 6-15Å, with the layers being alternately stacked repeatedly until the total thickness of the recording medium becomes 110-270Å.

The manufacturing method for the multi-layer thin film employs a vacuum chamber which accommodates a rotary table. The substrates are mounted upon the rotary table and a plurality of crucibles containing either Co or Pd are disposed below the rotary table.

In such an apparatus, the Co and Pd in the crucibles is deposited onto the substrate by applying the thermal evaporation deposition method, and then a second deposition is performed by rotating the rotary table so that Pd is deposited on the Co, and vice versa. The depositions are repeated to form a multi-layer film of Co/Pd.

However, in the above described manufacturing method, production is limited making continuous mass production difficult. Further, the thermal evaporation deposition method makes the manufacturing method unsuitable for the high melting point materials such as Pt, and makes it difficult to obtain a uniform deposition.

SUMMARY OF THE INVENTION

It is the object of the present invention to provide a process for fabricating a magneto-optic recording medium. The process comprises arranging a first metal region and a second metal region in this order in the order in a substantially linear, alternating array on a target and then applying a voltage to the target to sputter from a single target in the argon atmosphere. The sputtered materials are deposited on a substrate which is moved substantially parallel to the target. As the substrate moves, the first and second metals are alternately deposited on it. The metal regions are isolated from one another on the target to prevent cross continuation.

BRIEF DESCRIPTION OF THE DRAWINGS

The above object and other advantages of the present invention will become more apparent by reference to the preferred embodiment of the present invention in conjunction with the drawings in which.

DESCRIPTION OF THE PREFERRED EMBODIMENT

The process for fabrication of a magneto-optic recording medium according to the present invention comprises arranging Co and Pd or Co and Pt in the recited order, and isolating the elements by means of isolating plates. A substrate is reciprocated horizontally over the arrangement of elements and a sputtering method is applied to deposit the Co and Pd respectively or the Co and Pt respectively onto the substrate.

Figure 1A:
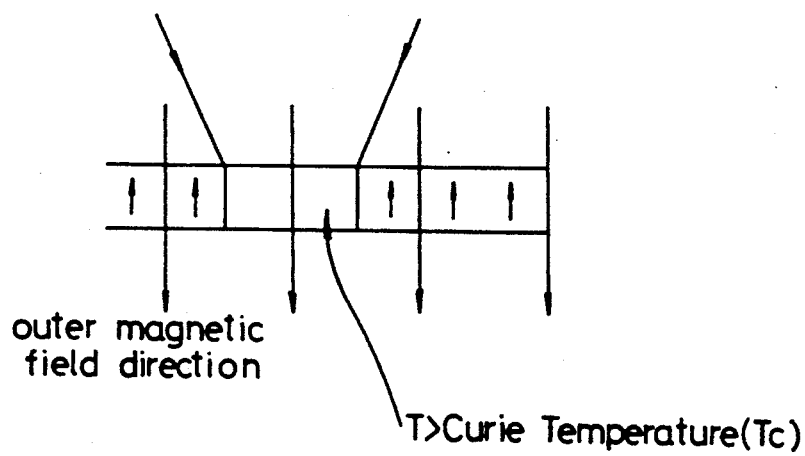
FIG. 1A illustrates recording of information.
Figure 1B:
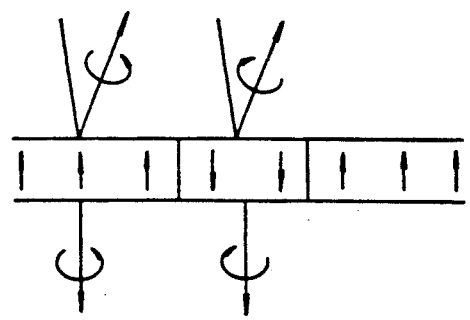
FIG. 1B illustrates reading of information.
Figure 1C:
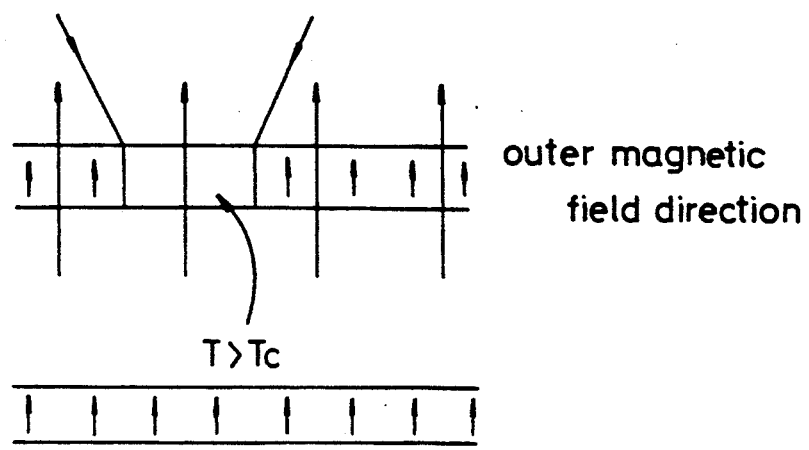
FIG. 1C illustrates erasing of information.
Figure 2:
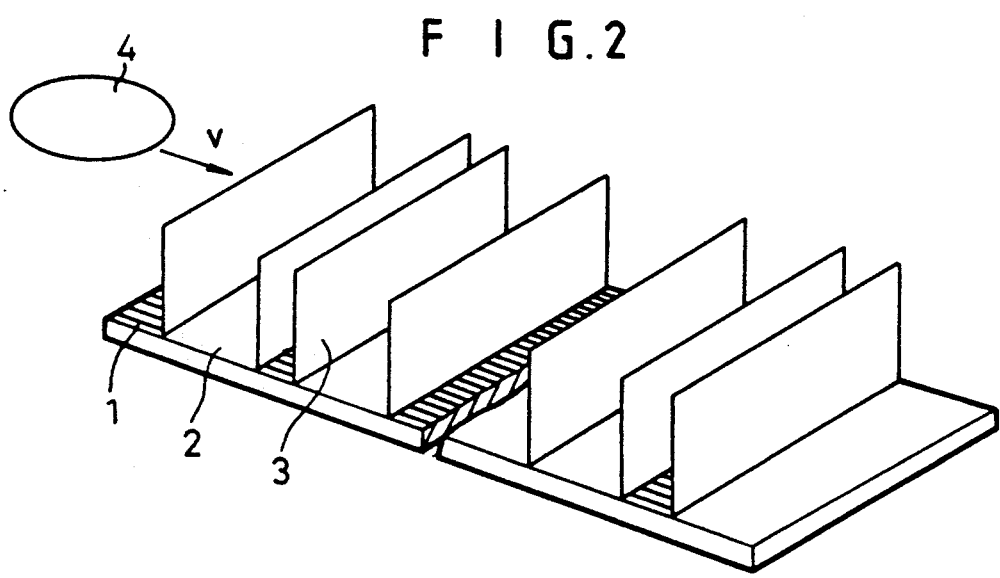
FIG. 2 schematically illustrates the apparatus for carrying out one embodiment of the invention.

Referring to FIG. 2, a plurality of regions, a region 1 of Co and a region 2 of Pd or Pt are serially arranged in the recited order within a vacuum chamber to form a target, and isolating plates 3 are installed between the Co region 1 and Pd or Pt region 2.

A substrate 4 is located over the isolating plates 3. In this embodiment power is applied to a particular portion of the target in an argon atmosphere. Ionized argon gas is accelerated toward the charged target to collide with it and cause the material to be sputtered out of the target and deposit onto the substrate 4. If, for example, the base plate is moved to the right, Co first deposits. Then, after the base plate 4 passes the Co region and enters the Pd or Pt region 2, Pd or Pt is deposited upon the Co layer. This deposition process is repeated, and a multi-layer film of alternating layers of Co/Pd or Co/Pt is formed. The function of the isolating plates 3 is to prevent simultaneous deposition of Co and Pd or Pt which would form a metal mixture.

The arrangement of Co regions and Pd or Pt regions can be determined by the required number of the sub-layers. Further, because the substrate 4 can be reciprocally moved to the left and right in performing the depositions, the number of Co and Pd or Pt regions does not have to equal the total number of sublayers.

The width, d, of the Co or Pd or Pt regions between the isolating plates 3 is given by:

$$d = \frac{V}{R},$$

where V is the velocity of the substrate and R is the sputtering rate at a particular power. If $V=1$ cm/s, and $R=1$ Å/s, then $d=1$cm/Å. Accordingly, if the required thickness of one the metal sub-layers Co is 1 Å, then d is 1 cm.

According to the preferred embodiment above, Co and Pd or Pt are continuously deposited on substrate by the single target with isolating plates between the regions. Thus, a larger number of multi-layer films consisting of Co and Pd or Pt sub-layers can be formed by a simple process in short fabrication time.

What is claimed is:

1. A process for fabricating a magneto-optic recording medium, comprising the steps of:
    a) arranging a first metal region and a second metal region in a substantially linear, alternating array on a target;
    b) applying a voltage to said target to induce sputtering of either said first metal or said second metal from said target;
    c) moving a substrate substantially parallel to said target such that the first and the second metal are alternatively deposited on said substrate; and
    d) isolating said regions from one another to retard said first metal and said second metal from depositing on said base as a mixture of metals.

2. The process of claim 1, wherein said process is conducted at pressure less than atmospheric pressure.

3. The process of claim 2, wherein said process is conducted in a gaseous atmosphere wherein said atmosphere consists essentially of an inert gas.

4. The process of claim 1, wherein said base plate is repeatedly reciprocated between a position adjacent a first metal region and a position adjacent a second metal region.

5. The process of claim 1, wherein said first metal consisting of the transition metals.

6. The process of claim 5, wherein said second metal consists of a metal selected from the group consisting of the rare earth elements.

7. The process of claim 1, wherein said first metal consists essentially of cobalt.

8. The process of claim 6, wherein said second metal consists essentially of palladium or platinum.

9. A process of fabricating a magneto-optic recording medium, comprising the steps of:
    a) arranging at least one region consisting essentially of cobalt and at least one region consisting essentially of palladium or platinum in a substantially linear, alternating array on a target;
    b) applying a voltage to said target to induce sputtering of either said cobalt or said palladium or platinum from said target;
    c) moving a substrate substantially linearly and horizontally with respect to said target such that cobalt and platinum or palladium are alternately deposited on said substrate; and
    d) isolating each region of cobalt from each adjacent region of palladium or platinum to retard depositing a mixture of cobalt and platinum or a mixture of cobalt and palladium on said substrate.

10. The process of claim 9, wherein said process is conducted at a pressure less than atomospheric pressure in a gaseous atmosphere consisting essentially of argon.

11. The process of claim 9, wherein said recording medium comprises alternate layers of cobalt and platinum.

12. The process of claim 9, wherein said recording medium comprises alternate layers of cobalt and palladium.

13. The process of claim 9, wherein said substrate is repeatedly reciprocated between a position above a cobalt region and a position above a region of palladium or platinum.

14. The process of claim 9, wherein said target includes a plurality of cobalt and platinum or palladium regions to form a repeating linear array of alternating regions, said substrate being moved linearly along said repeating linear array of regions.

* * * * *

UNITED STATES PATENT AND TRADEMARK OFFICE
CERTIFICATE OF CORRECTION

PATENT NO. : 5,232,567
DATED : August 03, 1993
INVENTOR(S) : Sung Chul Shin et al.

It is certified that error appears in the above-indentified patent and that said Letters Patent is hereby corrected as shown below:

Abstract, title page, line 5, before "substrate" delete --a--.

Claim 1, column 4, line 3, change "base" to --substrate--.

Claim 4, column 4, line 9, change "baseplate" to --substrate--.

*Claim 5, column 4, line 14, before "consisting" insert --consists essentially of a metal selected from the group--.

*Claim 9, column 4, line 22, change "of" to --for--.

Signed and Sealed this

Twentieth Day of September, 1994

Attest:

BRUCE LEHMAN

*Attesting Officer*   *Commissioner of Patents and Trademarks*